(12) United States Patent
Yoneda

(10) Patent No.: US 9,030,232 B2
(45) Date of Patent: May 12, 2015

(54) ISOLATOR CIRCUIT AND SEMICONDUCTOR DEVICE

(71) Applicant: Semiconductor Energy Laboratory Co., Ltd., Atsugi-shi, Kanagawa-ken (JP)

(72) Inventor: Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 120 days.

(21) Appl. No.: 13/857,185

(22) Filed: Apr. 5, 2013

(65) Prior Publication Data

US 2013/0270551 A1 Oct. 17, 2013

(30) Foreign Application Priority Data

Apr. 13, 2012 (JP) ................................. 2012-091727

(51) Int. Cl.
| | | |
|---|---|---|
| H03K 19/086 | (2006.01) | |
| H03K 19/23 | (2006.01) | |
| H01L 27/06 | (2006.01) | |
| H01L 27/12 | (2006.01) | |

(52) U.S. Cl.
CPC ........ *H01L 27/0605* (2013.01); *H01L 27/0688* (2013.01); *H01L 27/1203* (2013.01)

(58) Field of Classification Search
CPC ....... H02M 7/537; H02M 3/335; H03K 19/00
USPC ............. 363/131, 21.04, 21.05, 21.07, 21.13, 363/21.15; 326/93, 95, 96, 97, 98, 112, 326/113, 114, 115, 118, 119, 122, 43, 44, 326/36
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Minh D A
(74) *Attorney, Agent, or Firm* — Fish & Richardson P.C.

(57) ABSTRACT

An isolator circuit capable of two-way electrical disconnection and a semiconductor device including the isolator circuit are provided. A data holding portion is provided in an isolator circuit without the need for additional provision of a data holding portion outside the isolator circuit, and data which is to be input to a logic circuit that is in an off state at this moment is stored in the data holding portion. The data holding portion may be formed using a transistor with small off-state current and a buffer. The buffer can include an inverter circuit and a clocked inverter circuit.

20 Claims, 7 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,643,368 B2 | 1/2010 | Choi et al. |
| 7,674,650 B2 | 3/2010 | Akimoto et al. |
| 7,683,654 B2 * | 3/2010 | Chen et al. ............ 326/21 |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0274356 A1 | 11/2012 | Takahashi |
| 2013/0134416 A1 | 5/2013 | Nishijima et al. |
| 2013/0191673 A1 | 7/2013 | Koyama et al. |
| 2013/0235689 A1 | 9/2013 | Koyama |
| 2013/0262828 A1 | 10/2013 | Yoneda |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-172230 A | 7/2008 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

(56) References Cited

OTHER PUBLICATIONS

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

(56) References Cited

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

ISOLATOR CIRCUIT AND SEMICONDUCTOR DEVICE

BACKGROUND OF THE INVENTION

1. Field of the Invention

The present invention relates to a semiconductor device. In this specification, a semiconductor device refers to a semiconductor element itself or a device including a semiconductor element. As such a semiconductor element, a thin film transistor is given, for example. Therefore, the semiconductor device includes a liquid crystal display device, a memory device, and the like.

2. Description of the Related Art

In recent years, a portable semiconductor device such as a mobile computer has been rapidly spread. Although such a portable semiconductor device includes a power storage portion and operates using power fed from the power storage portion, the charge/discharge capacity of the power storage portion is finite. Accordingly, there is a demand for reducing power consumption as much as possible.

However, power consumption of a processor has been increased with an improvement in performance of a semiconductor device. In view of this situation, reduction in power consumption of a processor has been attempted using a power gating technique in which power consumption is reduced by stopping power feeding to a logic circuit which is not in processing (see Patent Document 1).

When a logic circuit to which power feeding is stopped and a logic circuit to which power feeding is being performed are electrically connected to each other by a signal line in the case of using the power gating technique for the processor, reverse current to a power supply line or an increase in consumption current due to an intermediate potential may be caused. Such a problem can be solved by provision of an isolator circuit between the logic circuit and the signal line.

REFERENCE

Patent Document

[Patent Document 1] Japanese Published Patent Application No. 2008-172230

SUMMARY OF THE INVENTION

An object of one embodiment of the present invention is to provide a novel isolator circuit capable of two-way electrical disconnection and a semiconductor device including the isolator circuit.

One embodiment of the present invention is an isolator circuit in which two one-way isolator circuits each capable of one-way electrical disconnection are combined.

Another embodiment of the present invention is a semiconductor device in which a logic circuit and a signal line are electrically connected to each other through an isolator circuit having the above structure.

Another embodiment of the present invention is a semiconductor device including a plurality of isolator circuits each having the above structure and a plurality of logic circuits. One of the plurality of logic circuits is electrically connected to a signal line through one of the plurality of isolator circuits.

With the embodiments of the present invention, a novel isolator circuit capable of two-way electrical disconnection and a semiconductor device including the isolator circuit can be provided.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Embodiment 1

In this embodiment, an isolator circuit which is one embodiment of the present invention will be described with reference to FIGS. 1A and 1B, FIGS. 2A to 2C, FIG. 3, FIG. 4, and FIG. 5.

Figure 1A:
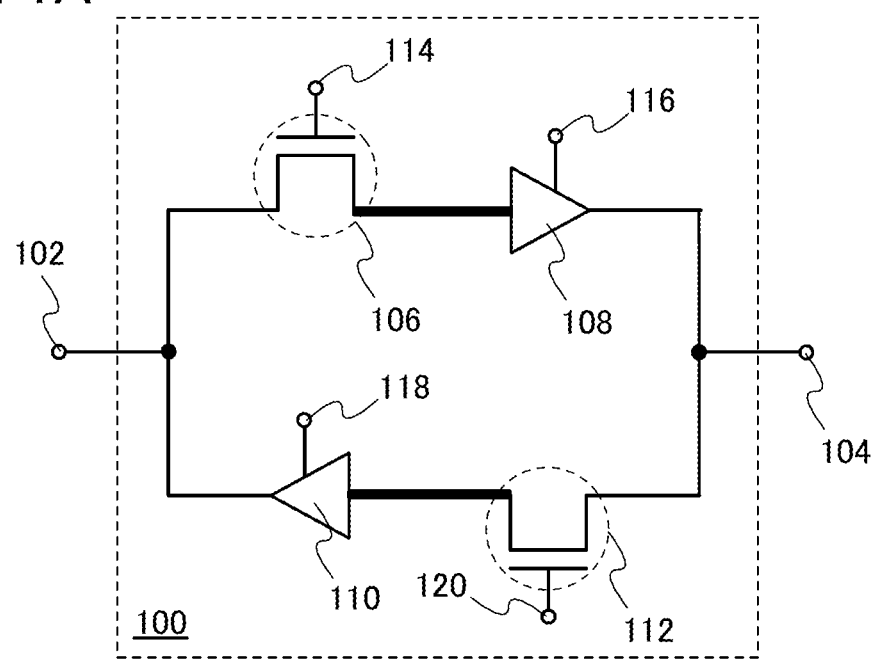
FIGS. 1A and 1B are views illustrating one structural example and one application example, respectively, of an isolator circuit which is one embodiment of the present invention.

FIG. 1A illustrates a circuit 100 functioning as an isolator circuit which is one embodiment of the present invention. The circuit 100 illustrated in FIG. 1A is electrically connected to a first terminal 102 and a second terminal 104. For example, the first terminal 102 and the second terminal 104 are an input terminal and an output terminal, respectively; however, without limitation thereto, the first terminal 102 and the second terminal 104 may be an output terminal and an input terminal, respectively.

Here, the first terminal 102 is electrically connected to one of a source and a drain of a first transistor 106, the other of the source and the drain of the first transistor 106 is electrically connected to an input terminal of a first buffer 108, and an output terminal of the first buffer 108 is electrically connected to the second terminal 104.

Further, the first terminal 102 is electrically connected to an output terminal of a second buffer 110, an input terminal of the second buffer 110 is electrically connected to one of a source and a drain of a second transistor 112, and the other of the source and the drain of the second transistor 112 is electrically connected to the second terminal 104.

A gate of the first transistor 106 is electrically connected to a terminal 114. A potential of the terminal 114 can be controlled. When the terminal 114 has a high potential (H), the first transistor 106 is on, and when the terminal 114 has a low potential (L), the first transistor 106 is off.

A terminal 116 is electrically connected to the first buffer 108. A potential of the terminal 116 can be controlled. The terminal 116 corresponds to a third terminal 310 in FIG. 3 which is described later.

A terminal 118 is electrically connected to the second buffer 110. A potential of the terminal 118 can be controlled. The terminal 118 corresponds to the third terminal 310 in FIG. 3 which is described later, as is the case with the terminal 116.

A gate of the second transistor 112 is electrically connected to a terminal 120. A potential of the terminal 120 can be controlled. When the terminal 120 has a high potential (H), the second transistor 112 is on, and when the terminal 120 has a low potential (L), the second transistor 112 is off.

Any transistor can be used as each of the first transistor 106 and the second transistor 112 as long as it has small off-state current.

Here, in a transistor with small off-state current, the off-state current per micrometer of channel width is 10 aA ($1 \times 10^{-17}$ A) or lower, preferably 1 aA ($1 \times 10^{-18}$ A) or lower, further preferably 10 zA ($1 \times 10^{-20}$ A) or lower, still further preferably 1 zA ($1 \times 10^{-21}$ A) or lower, most preferably 100 yA ($1 \times 10^{-22}$ A) or lower.

Any structure can be employed for each of the first buffer 108 and the second buffer 110 as long as it is a structure in which a data holding portion can be formed between the transistor and the buffer, and in which data in the data holding portion can be output to the first terminal 102 or the second terminal 104 when the terminal 116 or the terminal 118 has a high potential (H). Such a structure can be realized by a combination of an inverter and a clocked inverter, for example. Note that a specific structure of the first buffer 108 and the second buffer 110 will be described later with reference to FIG. 3. Note that the data holding portions are each denoted by a thick line in FIG. 1A.

Figure 1B:
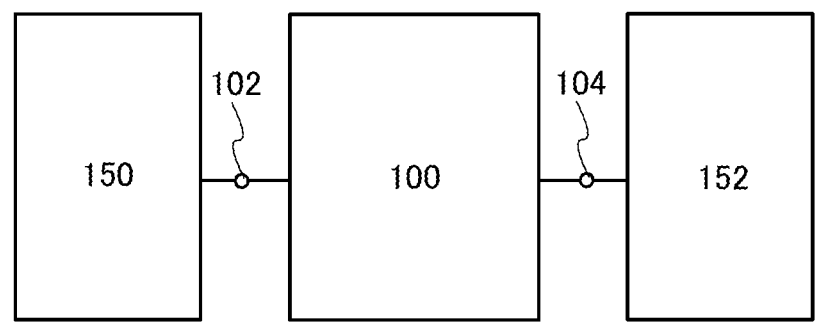

FIG. 1B is a view illustrating an application example of the circuit 100 in FIG. 1A. In FIG. 1B, the circuit 100 is provided between a first logic circuit 150 and a second logic circuit 152.

In the case where data output from the first logic circuit 150 is input to the second logic circuit 152 to be processed by the second logic circuit 152, the terminal 114, the terminal 118, and the terminal 120 are each set to have a low potential (L), and the terminal 116 is set to have a high potential (H). Thus, even when the first logic circuit 150 is turned off, the second logic circuit 152 can continue processing using the data in the data holding portion which is provided between the first transistor 106 and the first buffer 108.

Figure 2A:
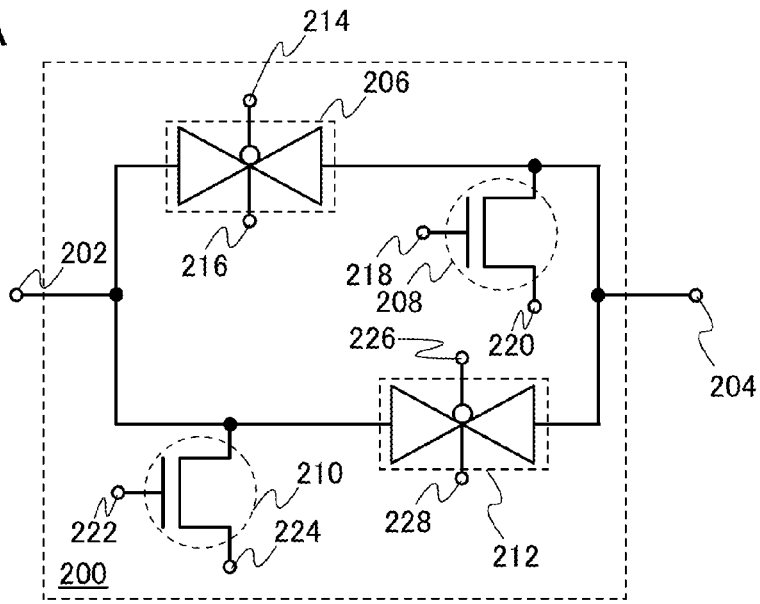
FIGS. 2A to 2C are views illustrating structural examples of an isolator circuit which is one embodiment of the present invention.

Here, another embodiment of an isolator circuit of the present invention will be described. FIG. 2A illustrates a circuit 200 as an example of an isolator circuit which is another embodiment of the present invention. The circuit 200 in FIG. 2A is electrically connected to a first terminal 202 and a second terminal 204.

Here, the first terminal 202 is electrically connected to an input terminal of a first transmission gate 206, and an output terminal of the first transmission gate 206 is electrically connected to the second terminal 204 and one of a source and a drain of a first transistor 208.

Further, the first terminal 202 is electrically connected to one of a source and a drain of a second transistor 210 and an output terminal of a second transmission gate 212, and an input terminal of the second transmission gate 212 is electrically connected to the second terminal 204.

Note that the input terminal and the output terminal of each of the first transmission gate 206 and the second transmission gate 212 may be reversed.

Figure 2B:
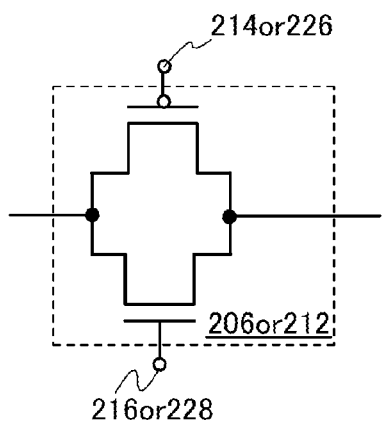

FIG. 2B illustrates an example of a specific structure of the first transmission gate 206 or the second transmission gate 212.

The first transmission gate 206 is electrically connected to a first control terminal 214 and a second control terminal 216. Potentials of the first control terminal 214 and the second control terminal 216 can be controlled.

In the case where the first control terminal 214 has a high potential (H) and the second control terminal 216 has a low potential (L), a p-channel transistor and an n-channel transistor in the first transmission gate 206 are both turned off.

In the case where the first control terminal 214 has a low potential (L) and the second control terminal 216 has a high potential (H), the p-channel transistor and the n-channel transistor in the first transmission gate 206 are both turned on.

A gate of the first transistor 208 is electrically connected to a terminal 218. The other of the source and the drain of the first transistor 208 is electrically connected to a terminal 220. A potential of the terminal 218 can be controlled. When the terminal 218 has a high potential (H), the first transistor 208 is on, and when the terminal 218 has a low potential (L), the first transistor 208 is off. The terminal 220 is electrically connected to a low-potential power supply line Vss.

A gate of the second transistor 210 is electrically connected to a terminal 222. The other of the source and the drain of the second transistor 210 is electrically connected to a terminal 224. A potential of the terminal 222 can be controlled. When the terminal 222 has a high potential (H), the second transistor 210 is turned on, and when the terminal 222 has a low potential (L), the second transistor 210 is turned off. The terminal 224 is electrically connected to the low-potential power supply line Vss.

The second transmission gate 212 is electrically connected to a first control terminal 226 and a second control terminal 228. Potentials of the first control terminal 226 and the second control terminal 228 can be controlled.

In the case where the first control terminal 226 has a high potential (H) and the second control terminal 228 has a low potential (L), a p-channel transistor and an n-channel transistor in the second transmission gate 212 are both turned off.

In the case where the first control terminal 226 has a low potential (L) and the second control terminal 228 has a high potential (H), the p-channel transistor and the n-channel transistor in the second transmission gate 212 are both turned on.

Figure 2C:
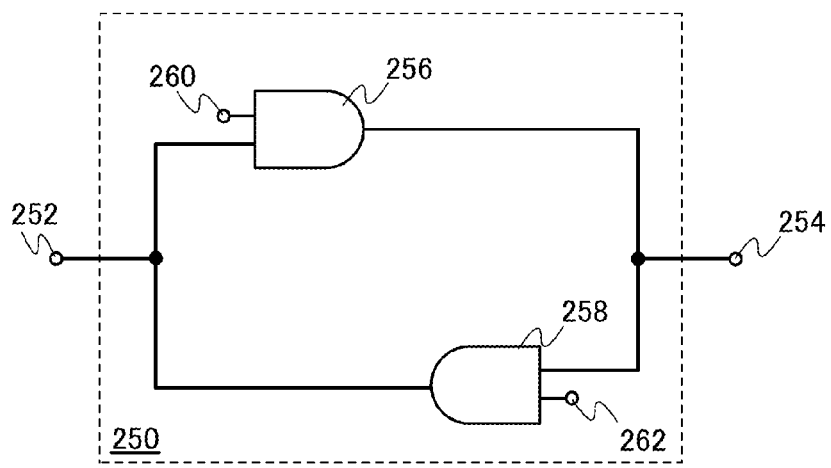

FIG. 2C illustrates a circuit 250 as an example of an isolator circuit which is another embodiment of the present invention. The circuit 250 in FIG. 2C is electrically connected to a first terminal 252 and a second terminal 254.

Here, the first terminal 252 is electrically connected to one of input terminals of a first AND circuit 256, and an output terminal of the first AND circuit 256 is electrically connected to the second terminal 254. Note that the other of the input terminals of the first AND circuit 256 is electrically connected to a terminal 260.

Further, the first terminal 252 is electrically connected to an output terminal of a second AND circuit 258. One of input terminals of the second AND circuit 258 is electrically connected to the second terminal 254, and the other of the input terminals of the second AND circuit 258 is electrically connected to a terminal 262.

Potentials of the terminal 260 and the terminal 262 can be controlled. When the terminal 260 has a high potential (H) and a signal is supplied from the first terminal 252 (the first terminal 252 has a high potential (H)), the signal is output from the output terminal of the first AND circuit 256. When the terminal 260 has a low potential (L), even in the case where the signal is supplied from the first terminal 252 (even in the case where the first terminal 252 has a high potential (H)), the signal is not output from the output terminal of the first AND circuit 256. Thus, signal transmission can be controlled.

However, in each of the structures of the other embodiments of the present invention which are illustrated in FIGS. 2A and 2C, a data holding portion is not provided, and accordingly, data is erased when power is turned off. Therefore, a data holding portion needs to be provided additionally for enabling data hold. In view of the above, when the structure illustrated in FIG. 1A which is one embodiment of the present invention is employed, a data holding portion is provided in an isolator circuit, so that an isolator circuit where data is not erased even when power is turned off can be obtained without the need for additional provision of a data holding portion.

Accordingly, in the case where a logic circuit (a circuit to which data is input) performs processing with the use of an output result from another logic circuit (a circuit which outputs the data), the logic circuit to which the data is input can continue the processing even when power feeding to the logic circuit which has output the data is stopped.

An object of one embodiment of the present invention which is illustrated in FIG. 1A is to provide a semiconductor device in which a logic circuit (a circuit to which data is input) can continue processing even when another logic circuit which outputs the data which is input to the logic circuit (the circuit to which the data is input) is turned off.

An object of one embodiment of the present invention which is illustrated in FIG. 1A is to provide a semiconductor device in which even when data which is input to a logic circuit is output from another logic circuit, the latter logic circuit which outputs the data which is input to the former logic circuit can be turned off.

An object of one embodiment of the present invention which is illustrated in FIG. 1A is to achieve the above-described objects without the need for additional provision of a data holding portion.

In one embodiment of the present invention which is illustrated in FIG. 1A, a data holding portion is provided in an isolator circuit without the need for additional provision of a data holding portion outside, and data which is input to a logic circuit which outputs the data is stored in the data holding portion.

One embodiment of the present invention which is illustrated in FIG. 1A is an isolator circuit including a first terminal, a second terminal, a first transistor, a second transistor, a first buffer, and a second buffer. The first terminal is electrically connected to one of a source and a drain of the first transistor and an output terminal of the second buffer. The other of the source and the drain of the first transistor is electrically connected to an input terminal of the first buffer. An input terminal of the second buffer is electrically connected to one of a source and a drain of the second transistor. The second terminal is electrically connected to an output terminal of the first buffer and the other of the source and the drain of the second transistor. The off-state current per micrometer of channel width in each of the first transistor and the second transistor is 10 aA ($1 \times 10^{-17}$ A) or lower.

In each of the first buffer and the second buffer in the isolator circuit having the above structure, an inverter and a clocked inverter are preferably provided.

In each of the first transistor and the second transistor in the isolator circuit having the above structure, a channel is preferably formed in an oxide semiconductor layer.

By employing one embodiment of the present invention which is illustrated in FIG. 1A, data which is output from a logic circuit (a circuit which outputs data) and input to another logic circuit (a circuit to which the data is input) is held in the data holding portion provided in the isolator circuit, and thus the latter logic circuit (the circuit to which the data is input) can continue processing even when the former logic circuit (the circuit which outputs the data) is turned off.

By employing one embodiment of the present invention which is illustrated in FIG. 1A, data which is output from a logic circuit (a circuit which outputs data) and input to another logic circuit (a circuit to which the data is input) is held in the data holding portion provided in the isolator circuit, and thus the former logic circuit (the circuit which outputs the data) can be turned off even in the case where the latter logic circuit (the circuit to which the data is input) continues processing.

Note that since the data holding portion is provided in the isolator circuit in one embodiment of the present invention which is illustrated in FIG. 1A, it is not necessary to provide a data holding portion additionally.

Figure 3:
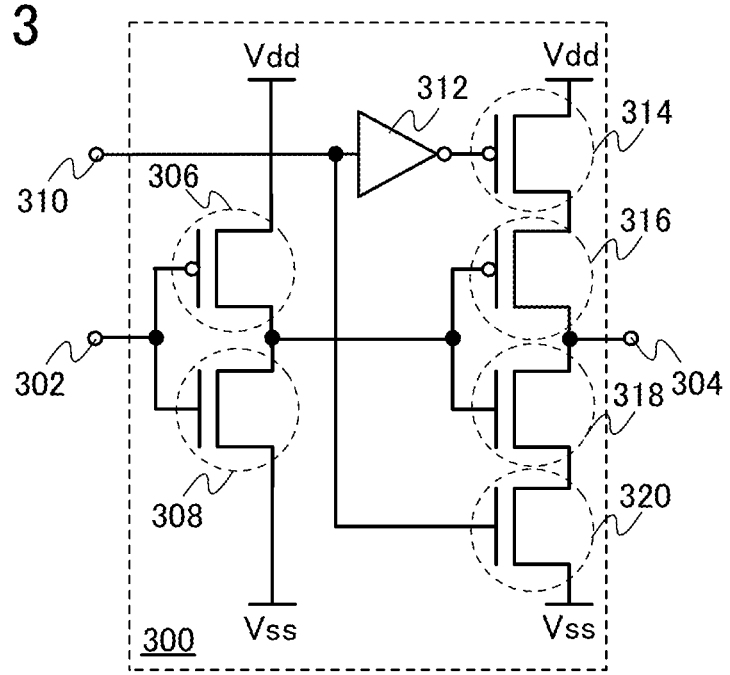
FIG. 3 is a view illustrating a specific structure of part of the isolator circuit in FIGS. 1A and 1B.

FIG. 3 illustrates a circuit 300 as an example of the first buffer 108 and the second buffer 110 in FIG. 1A having a specific configuration. The circuit 300 in FIG. 3 is electrically connected to a first terminal 302 and a second terminal 304.

The circuit 300 in FIG. 3 includes an inverter circuit including a first transistor 306 and a second transistor 308; and a clocked inverter circuit including a third transistor 314, a fourth transistor 316, a fifth transistor 318, and a sixth transistor 320.

The first terminal 302 is electrically connected to a gate of the first transistor 306 and a gate of the second transistor 308. One of a source and a drain of the first transistor 306 is electrically connected to a high-potential power supply line Vdd. The other of the source and the drain of the first transistor 306 is electrically connected to one of a source and a drain of the second transistor 308. The other of the source and the drain of the second transistor 308 is electrically connected to the low-potential power supply line Vss.

The third terminal 310 is electrically connected to an input terminal of a NOT circuit 312 and a gate of the sixth transistor 320. An output terminal of the NOT circuit 312 is electrically connected to a gate of the third transistor 314.

A gate of the fourth transistor 316 and a gate of the fifth transistor 318 are electrically connected to the other of the source and the drain of the first transistor 306 and the one of the source and the drain of the second transistor 308.

One of a source and a drain of the third transistor 314 is electrically connected to the high-potential power supply line Vdd. The other of the source and the drain of the third transistor 314 is electrically connected to one of a source and a drain of the fourth transistor 316. The other of the source and the drain of the fourth transistor 316 is electrically connected to one of a source and a drain of the fifth transistor 318. The other of the source and the drain of the fifth transistor 318 is electrically connected to one of a source and a drain of the sixth transistor 320. The other of the source and the drain of the sixth transistor 320 is electrically connected to the low-potential power supply line Vss.

The other of the source and the drain of the fourth transistor 316 and the one of the source and the drain of the fifth transistor 318 are electrically connected to the second terminal 304.

Note that the first transistor 306, the third transistor 314, and the fourth transistor 316 are p-channel transistors, and the second transistor 308, the fifth transistor 318, and the sixth transistor 320 are n-channel transistors.

The first terminal 302 is an input terminal of the circuit 300. The second terminal 304 is an output terminal of the circuit 300.

A potential of the third terminal 310 can be controlled, and the third terminal 310 corresponds to the terminal 116 or the terminal 118 in FIG. 1A.

The isolator circuit which is one embodiment of the present invention described above can be applied to a semiconductor device. A semiconductor device including the isolator circuit which is one embodiment of the present invention will be described below.

Figure 4:
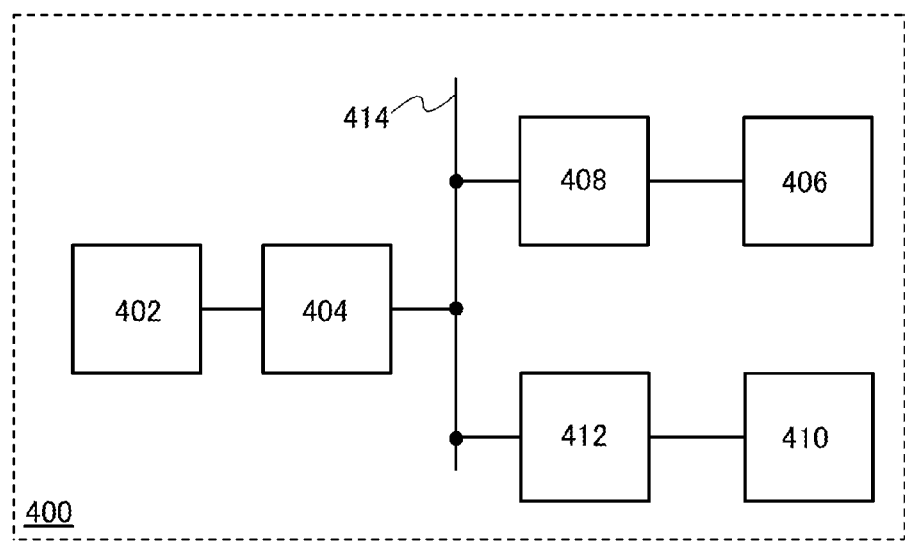
FIG. 4 is a view illustrating a semiconductor device which is one embodiment of the present invention.

FIG. 4 illustrates a semiconductor device 400 as a semiconductor device which is one embodiment of the present invention. The semiconductor device 400 includes a first logic circuit 402, a second logic circuit 406, and a third logic circuit 410. A first isolator circuit 404, a second isolator circuit 408, and a third isolator circuit 412 are electrically connected to the first logic circuit 402, the second logic circuit 406, and the third logic circuit 410, respectively.

The first isolator circuit 404, the second isolator circuit 408, and the third isolator circuit 412 each correspond to the circuit 100 in FIG. 1A.

There is no particular limitation on structures of the first logic circuit 402, the second logic circuit 406, and the third logic circuit 410 as long as they are logic circuits.

The first logic circuit 402, the second logic circuit 406, and the third logic circuit 410 which are included in the semiconductor device 400 are electrically connected to a signal line 414, which is shared among these logic circuits, through the first isolator circuit 404, the second isolator circuit 408, and the third isolator circuit 412, respectively. In other words, the first logic circuit 402, the second logic circuit 406, and the third logic circuit 410 share one signal line.

Here, the structure in which a plurality of logic circuits are electrically connected to one signal line which is shared among the plurality of logic circuits as in FIG. 4 will be described with reference to FIG. 5.

Figure 5:
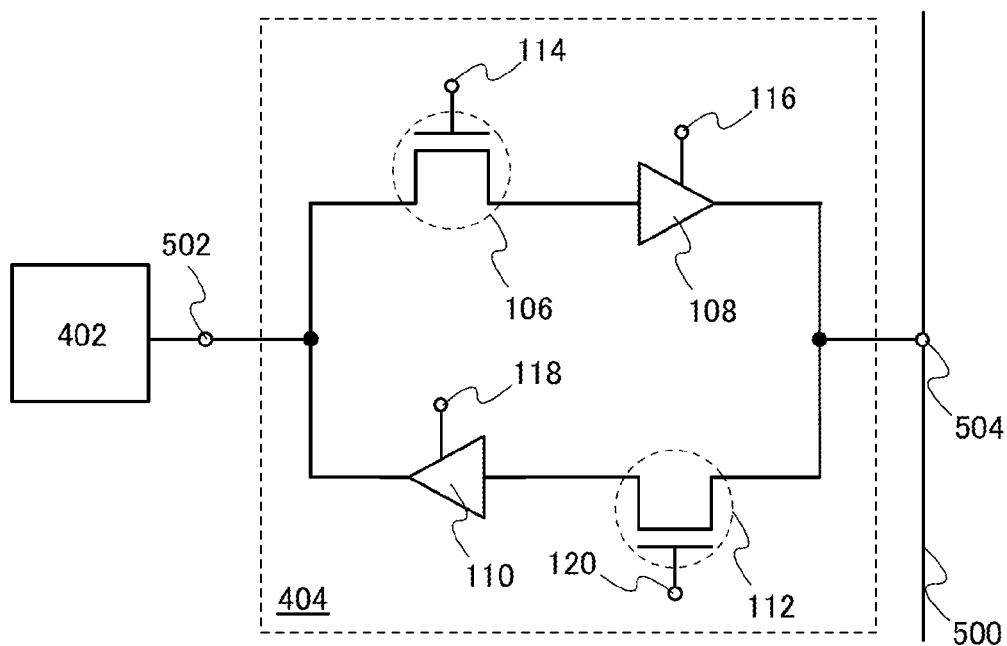
FIG. 5 is a view illustrating a first logic circuit 402 and a first isolator circuit 404 in FIG. 4.

FIG. 5 focuses on the first logic circuit 402 and the first isolator circuit 404 in the structure. The first isolator circuit 404 corresponds to the circuit 100 in FIG. 1A; therefore, the same reference numerals as those in FIG. 1A are used. Further, a first terminal 502 and a second terminal 504 correspond to the first terminal 102 and the second terminal 104 in FIG. 1A, respectively.

In the case where data from the first logic circuit 402 is output to a signal line 500 without turning off the first logic circuit 402, the terminal 114 and the terminal 116 are each set to have a high potential (H), and the terminal 118 and the terminal 120 are each set to have a low potential (L). Note that the signal line 500 corresponds to the signal line 414 in FIG. 4.

In the case where data which is to be processed by the first logic circuit 402 is input from the signal line 500 without turning off the first logic circuit 402, the terminal 114 and the terminal 116 are each set to have a low potential (L), and the terminal 118 and the terminal 120 are each set to have a high potential (H).

While the data from the first logic circuit 402 is output to the signal line 500 and before the first logic circuit 402 is turned off, the terminal 114, the terminal 118, and the terminal 120 are each set to have a low potential (L), and the terminal 116 is set to have a high potential (H). With this method, the necessary data is output to the signal line 500 even when the first logic circuit 402 is turned off. In other words, the first logic circuit 402 can be turned off even in the case where the data from the first logic circuit 402 needs to be output to the signal line 500. In this manner, while the first logic circuit 402 in an off state is electrically disconnected from another logic circuit in an on state, output result from the first logic circuit 402 can be used in the logic circuit in an on state. Note that the terminal 116 is set to have a low potential (L) in the case where the data from the first logic circuit 402 does not need to be output to the signal line 500.

Note that in the case where the logic circuit in an on state is turned off while data is input from the signal line 500 to the first logic circuit 402, the terminals 114, 116, 118, and 120 are each set to have a low potential (L) before the logic circuit in an on state is turned off. In this manner, the first logic circuit 402 in an off state can be electrically disconnected from the logic circuit in an on state.

As described above, a semiconductor device which is one embodiment of the present invention includes isolator circuits which are each one embodiment of the present invention. The use of the isolator circuits enables each of logic circuits included in the semiconductor device to be turned off, so that power consumption can be reduced effectively. Thus, the logic circuit in an off state and the logic circuit in an on state are electrically disconnected from each other, whereby reverse current to a power supply line or an increase in consumption current due to an intermediate potential can be prevented, and the logic circuit in an on state can perform processing using an output result that is obtained from the logic circuit in an off state just before the logic circuit is turned off.

Embodiment 2

In this embodiment, an example of a structure of a semiconductor device which is one embodiment of the present invention will be described.

First, examples of a structure of a transistor with small off-state current that can be used in a semiconductor device which is one embodiment of the present invention will be described with reference to schematic cross-sectional views in FIGS. 6A and 6B. Note that the scale of each of components illustrated in FIGS. 6A and 6B may be different from the actual scale.

Figure 6A:
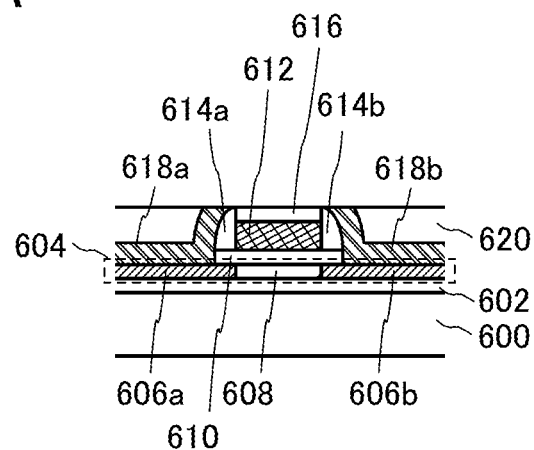
FIGS. 6A and 6B are views each illustrating an example of a cross section of a transistor which can be applied to one embodiment of the present invention.

A transistor illustrated in FIG. 6A includes a semiconductor layer 604, an insulating layer 610, a conductive layer 612, an insulating layer 614a, an insulating layer 614b, an insulating layer 616, a conductive layer 618a, a conductive layer 618b, and an insulating layer 620.

The semiconductor layer 604 is provided over an element formation layer 600 with an insulating layer 602 placed therebetween. Note that there is no limitation thereto, and the semiconductor layer 604 may be directly provided over the element formation layer 600.

The semiconductor layer 604 includes a region 606a and a region 606b to which dopant is added, and further includes a channel formation region 608 between the region 606a and the region 606b.

The insulating layer 610 is provided over part of the semiconductor layer 604.

The conductive layer 612 is provided to overlap with the semiconductor layer 604 with the insulating layer 610 placed therebetween.

The insulating layer 614a and the insulating layer 614b are each a sidewall insulating layer which is provided in contact with a side surface of the conductive layer 612.

The insulating layer 616 is provided over the conductive layer 612.

The conductive layer 618a and the conductive layer 618b are provided in contact with the region 606a and the region 606b, respectively. The conductive layer 618a and the conductive layer 618b are also provided in contact with a side surface of the insulating layer 614a and a side surface of the insulating layer 614b, respectively.

The insulating layer 620 is provided over the conductive layer 618a and the conductive layer 618b.

The conductive layer 618a, the conductive layer 618b, and the insulating layer 620 are formed by CMP treatment, for example.

Figure 6B:
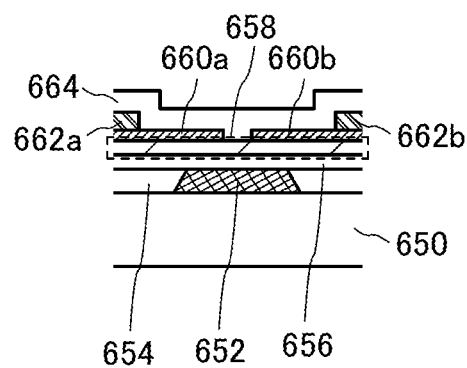

A transistor illustrated in FIG. 6B includes a conductive layer 652, an insulating layer 654, an insulating layer 656, a semiconductor layer 658, a conductive layer 660a, a conductive layer 660b, a conductive layer 662a, a conductive layer 662b, and an insulating layer 664.

The conductive layer 652 is provided over an element formation layer 650.

The insulating layer 654 is provided over the element formation layer 650. Surfaces of the conductive layer 652 and the insulating layer 654 are preferably flat.

The conductive layer 652 and the insulating layer 654 are formed by CMP treatment, for example.

The insulating layer 656 is provided over the conductive layer 652 and the insulating layer 654.

The semiconductor layer 658 is provided to overlap with the conductive layer 652 with the insulating layer 656 placed therebetween.

The conductive layer 660a and the conductive layer 660b are provided in contact with the semiconductor layer 658. The distance between the conductive layer 660a and the conductive layer 660b, which corresponds to a channel length of the transistor, is preferably shorter than 50 nm. The distance between the conductive layers 660a and 660b can be made shorter than 50 nm in such a manner that, for example, part of a conductive film is etched using a resist mask formed by electron beam exposure. Further, the distance between the conductive layers 660a and 660b is preferably shorter than a distance between the conductive layers 662a and 662b, as illustrated in FIG. 6B.

The conductive layer 662a is provided on and in contact with part of the conductive layer 660a, and the conductive layer 662b is provided on and in contact with part of the conductive layer 660b. The electrical resistivity per unit area of the conductive layers 662a and 662b is preferably lower than that of the conductive layers 660a and 660b.

The insulating layer 664 is provided so as to cover the semiconductor layer 658.

Next, each of the components illustrated in FIGS. 6A and 6B will be described. Note that the components each have either a single-layer structure or a stacked-layer structure in which a plurality of layers are stacked.

The insulating layer 602 is a base layer. The insulating layer 602 can be formed using, for example, a material such as silicon oxide, silicon nitride, silicon oxynitride, silicon nitride oxide, aluminum oxide, aluminum nitride, aluminum oxynitride, aluminum nitride oxide, or hafnium oxide.

The insulating layer 654 may be formed using the same material as the insulating layer 602.

Each of the semiconductor layers 604 and 658 functions as a layer in which a channel of the transistor is formed (a channel formation layer). Here, the semiconductor layer 604 in FIG. 6A and the semiconductor layer 658 in FIG. 6B will be described.

As each of the semiconductor layers 604 and 658, for example, an oxide semiconductor layer can be used.

A structure of an oxide semiconductor layer is described below.

An oxide semiconductor layer is classified roughly into a single-crystal oxide semiconductor layer and a non-single-crystal oxide semiconductor layer. The non-single-crystal oxide semiconductor layer includes any of an amorphous oxide semiconductor layer, a microcrystalline oxide semiconductor layer, a polycrystalline oxide semiconductor layer, a c-axis aligned crystalline oxide semiconductor (CAAC-OS) layer, and the like.

The amorphous oxide semiconductor layer has disordered atomic arrangement and no crystalline component. A typical example thereof is an oxide semiconductor layer in which no crystal part exists even in a microscopic region, and the whole of the layer is amorphous.

The microcrystalline oxide semiconductor layer includes a microcrystal (also referred to as nanocrystal) with a size greater than or equal to 1 nm and less than 10 nm, for example. Thus, the microcrystalline oxide semiconductor layer has a higher degree of atomic order than the amorphous oxide semiconductor layer. Hence, the density of defect states of the microcrystalline oxide semiconductor layer is lower than that of the amorphous oxide semiconductor layer.

The CAAC-OS layer is one of oxide semiconductor layers including a plurality of crystal parts, and most of each crystal part fits inside a cube whose one side is less than 100 nm. Thus, there is a case where a crystal part included in the CAAC-OS layer fits a cube whose one side is less than 10 nm, less than 5 nm, or less than 3 nm. The density of defect states of the CAAC-OS layer is lower than that of the microcrystalline oxide semiconductor layer. The CAAC-OS layer is described in detail below.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a formation surface) or a top surface of the CAAC-OS layer, and is arranged in parallel to the formation surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS layer.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

On the other hand, when the CAAC-OS layer is analyzed by an in-plane method in which an X-ray enters a sample in a direction perpendicular to the c-axis, a peak appears frequently when $2\theta$ is around 56°. This peak is derived from the (110) plane of the InGaZnO$_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor layer of InGaZnO$_4$, six peaks appear. The six peaks are derived from crystal planes equivalent to the (110) plane. On the other hand, in the case of a CAAC-OS layer, a peak is not clearly observed even when $\phi$ scan is performed with $2\theta$ fixed at around 56°.

According to the above results, in the CAAC-OS layer having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with formation of the CAAC-OS layer or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS layer is changed by etching or the like, the c-axis might not be necessarily parallel to a normal vector of a formation surface or a normal vector of a top surface of the CAAC-OS layer.

Further, the degree of crystallinity in the CAAC-OS layer is not necessarily uniform. For example, in the case where crystal growth leading to the CAAC-OS layer occurs from the vicinity of the top surface of the layer, the degree of the crystallinity in the vicinity of the top surface is higher than that in the vicinity of the formation surface in some cases. Further, when an impurity is added to the CAAC-OS layer, the crystallinity in a region to which the impurity is added is changed, and the degree of crystallinity in the CAAC-OS layer varies depends on regions.

Note that when the CAAC-OS layer with an InGaZnO$_4$ crystal is analyzed by an out-of-plane method, a peak of $2\theta$ may also be observed at around 36°, in addition to the peak of $2\theta$ at around 31°. The peak of $2\theta$ at around 36° is derived from the (311) plane of a ZnGa$_2$O$_4$ crystal; such a peak indicates that a ZnGa$_2$O$_4$ crystal is included in part of the CAAC-OS layer including the InGaZnO$_4$ crystal. It is preferable that in the CAAC-OS layer, a peak of $2\theta$ appear at around 31° and a peak of $2\theta$ do not appear at around 36°.

In a transistor using the CAAC-OS layer, change in electric characteristics due to irradiation with visible light or ultraviolet light is small. Thus, the transistor has high reliability.

Note that an oxide semiconductor layer may be a stacked layer including two or more layers of an amorphous oxide semiconductor layer, a microcrystalline oxide semiconductor layer, and a CAAC-OS layer, for example.

Examples of the oxide semiconductor are a metal oxide containing zinc and at least one of indium and gallium, and the metal oxide in which gallium is partly or entirely replaced with another metal element.

As the metal oxide, an In-based metal oxide, a Zn-based metal oxide, an In—Zn-based metal oxide, or an In—Ga—Zn-based metal oxide can be used, for example. Alternatively, metal oxide including another metal element instead of part or all of gallium in the In—Ga—Zn-based metal oxide may be used.

As the aforementioned another metal element, for example, a metal element that is capable of combining with more oxygen atoms than gallium can be used, and one or more elements of titanium, zirconium, hafnium, germanium, and tin can be used, for instance. Alternatively, as the aforementioned another metal element, one or more elements of lanthanum, cerium, praseodymium, neodymium, samarium, europium, gadolinium, terbium, dysprosium, holmium, erbium, thulium, ytterbium, and lutetium may be used. These metal elements function as a stabilizer. Note that the amount of such a metal element added is determined so that the metal oxide can function as a semiconductor. When a metal element that is capable of combining with more oxygen atoms than gallium is used and oxygen is supplied to a metal oxide, oxygen defects in the metal oxide can be reduced.

For example, when tin is used instead of all of gallium contained in the In—Ga—Zn-based metal oxide, an In—Sn—Zn-based metal oxide is obtained. When titanium is replaced with part of gallium contained in the In—Ga—Zn-based metal oxide, an In—Ti—Ga—Zn-based metal oxide is obtained.

It is preferable to remove impurities such as hydrogen, water, a hydroxyl group, and a hydride (also referred to as a hydrogen compound) from an oxide semiconductor layer by dehydration or dehydrogenation and supply oxygen to the oxide semiconductor layer in the case where the oxide semiconductor layer is used as the semiconductor layers 604 and 658, because the oxide semiconductor layer can be highly purified. For example, a layer containing oxygen is formed as the layer in contact with the oxide semiconductor layer, and heat treatment is performed; thus, the oxide semiconductor layer can be highly purified.

In addition, the oxide semiconductor layer that has just been deposited is preferably supersaturated with oxygen so that the proportion of oxygen is higher than that in the stoichiometric composition. For example, in the case where the oxide semiconductor layer is deposited using a sputtering method, the deposition is preferably performed under the condition where the proportion of oxygen in a deposition gas is large, in particular, in an oxygen atmosphere (oxygen gas: 100%). Further, in order to sufficiently supply oxygen to supersaturate the oxide semiconductor layer with oxygen, an insulating layer containing excess oxygen (e.g., a SiO$_x$ layer where x>2) may be provided as the insulating layer in contact with the oxide semiconductor layer (e.g., the insulating layers 602, 610, 656, and 664).

The insulating layer containing excess oxygen is formed to contain much oxygen by adjusting the deposition condition in a CVD method or a sputtering method. In order to make the insulating layer contain much more excess oxygen, oxygen is added by ion implantation, ion doping, or plasma treatment. Moreover, oxygen may be added to the oxide semiconductor layer.

An entrapment vacuum pump is preferably used in a sputtering apparatus which is used for formation of the oxide semiconductor layer because it is preferable that as little moisture as possible remain in a deposition chamber. Further, the sputtering apparatus may be provided with a cold trap.

The oxide semiconductor layer is preferably subjected to heat treatment at a substrate temperature higher than or equal to 350° C. and lower than the strain point of a substrate, preferably at a substrate temperature ranging from 350° C. to 450° C. Heat treatment may be further performed in a later step. There is no particular limitation on a heat treatment apparatus to be used here, and an electric furnace or an a rapid thermal annealing (RTA) apparatus such as a gas rapid thermal annealing (GRTA) apparatus or a lamp rapid thermal annealing (LRTA) apparatus may be used. Heat treatment may be performed more than once.

After the heat treatment, a high-purity oxygen gas, a high-purity $N_2O$ gas, or ultra-dry air (having a dew point of $-40°$ C. or lower, preferably $-60°$ C. or lower) is preferably introduced in the furnace where the heat treatment has been performed while the heating temperature is being maintained or being decreased. In this case, it is preferable that the oxygen gas or the $N_2O$ gas do not contain water, hydrogen, and the like. The purity of the oxygen gas or the $N_2O$ gas which is introduced into the heat treatment apparatus is preferably 6N or higher, more preferably 7N or higher. That is, the impurity concentration of the oxygen gas or the $N_2O$ gas is 1 ppm or lower, preferably 0.1 ppm or lower. Through this step, oxygen is supplied to the oxide semiconductor layer, and oxygen vacancies in the oxide semiconductor layer can be reduced. Note that the introduction of a high-purity oxygen gas, a high-purity $N_2O$ gas, or ultra-dry air may be performed at the time of the above heat treatment.

The hydrogen concentration of the highly purified oxide semiconductor layer, measured by SIMS, is $5\times10^{19}$ atoms/$cm^3$ or lower, preferably $5\times10^{18}$ atoms/$cm^3$ or lower, more preferably $5\times10^{17}$ atoms/$cm^3$ or lower.

With the use of the highly purified oxide semiconductor layer for a field-effect transistor, the carrier density of the oxide semiconductor layer can be lower than $1\times10^{14}/cm^3$, preferably lower than $1\times10^{12}/cm^3$, further preferably lower than $1\times10^{11}/cm^3$. Such a low carrier density can reduce the off-state current of the field-effect transistor per micrometer of channel width to $1\times10^{-19}$ A (100 zA) or lower, preferably $1\times10^{-22}$ A (100 yA) or lower.

As the dopant contained in the regions 606a and 606b, it is possible to use, for example, one or more elements selected from Group 13 elements (e.g., boron) in the periodic table, Group 15 elements (e.g., nitrogen, phosphorus, and arsenic) in the periodic table, and rare gas elements (e.g., helium, argon, and xenon).

The insulating layers 610 and 656 each function as a gate insulating layer of the transistor. Each of the insulating layers 610 and 656 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

The conductive layers 612 and 652 each function as a gate of the transistor. Each of the conductive layers 612 and 652 can be, for example, a layer containing a metal material such as molybdenum, titanium, chromium, tantalum, magnesium, silver, tungsten, aluminum, copper, neodymium, or scandium.

Each of the insulating layers 614a, 614b, and 616 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide.

The conductive layers 618a and 618b, the conductive layers 660a and 660b, and the conductive layers 662a and 662b each function as a source or a drain of the transistor. Each of the conductive layers 618a and 618b, the conductive layers 660a and 660b, and the conductive layers 662a and 662b can be, for example, a layer containing a conductive material such as molybdenum, titanium, chromium, tantalum, magnesium, silver, tungsten, aluminum, copper, neodymium, scandium, or ruthenium.

The insulating layers 620 and 664 each function as a protection layer. Each of the insulating layers 620 and 664 can be, for example, a layer including a material such as silicon oxide, silicon nitride, silicon oxynitride, silicon nitride oxide, aluminum oxide, aluminum nitride, aluminum oxynitride, aluminum nitride oxide, or hafnium oxide.

Figure 7:
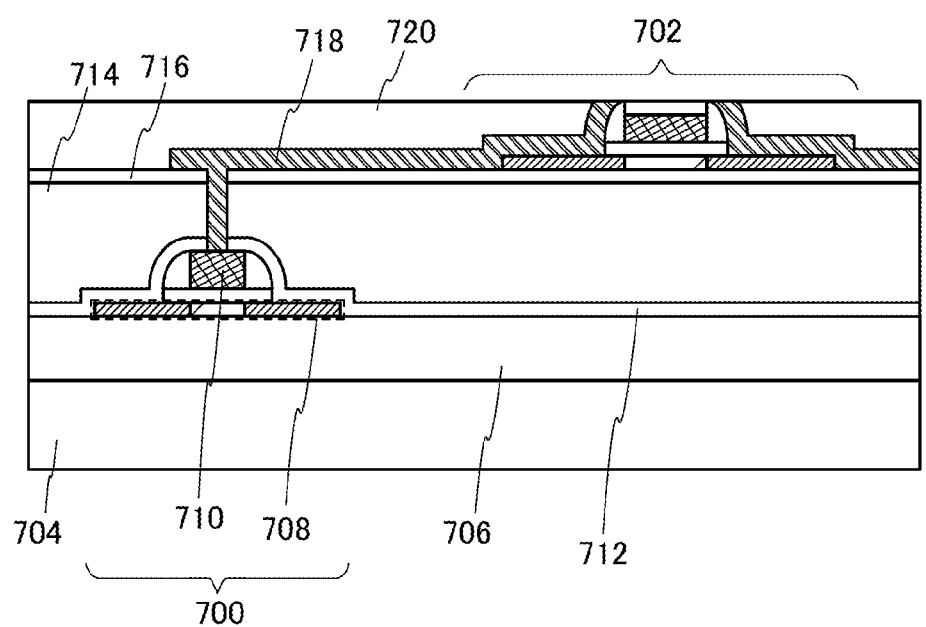
FIG. 7 is a view illustrating an example of a cross section of a transistor which can be applied to one embodiment of the present invention.

Next, an example of a structure of a semiconductor device including the transistor illustrated in FIG. 6A will be described with reference to FIG. 7. FIG. 7 is a schematic cross-sectional view illustrating an example of a structure of a semiconductor device in this embodiment.

The semiconductor device illustrated in FIG. 7 includes a transistor 700 including a single crystal silicon layer 708 that is a channel formation layer, and a transistor 702 that is stacked over the transistor 700 with insulating layers 712, 714, and 716 placed therebetween and has the structure illustrated in FIG. 6A. Further, an insulating layer 720 is provided in contact with the transistor 702.

The single crystal silicon layer 708 is provided over a substrate 704 with an insulating layer 706 (also referred to as BOX layer) placed therebetween. Note that the transistor 700 may be configured using a semiconductor region surrounded by a buried insulating region in a single crystal semiconductor substrate, instead of using the substrate 704, the insulating layer 706, and the single crystal silicon layer 708.

The insulating layer 712 functions as a protection layer. The insulating layer 714 functions as both a protection layer and a planarization layer. The insulating layer 716 functions as a base layer. Each of the insulating layers 712, 714, and 716 can be a layer containing a material similar to that of the insulating layer 602.

A conductive layer 718 functioning as a source or a drain of the transistor 702 is connected to a conductive layer 710 functioning as a gate of the transistor 700. Note that the conductive layer 718 and the conductive layer 710 may be connected to each other through a plurality of conductive layers.

The use of the transistor with small off-state current as the transistor 702 can increase the data retention time of a memory cell.

Further, the transistor 700 can be included in a logic circuit (including a volatile memory circuit) of a CPU, a signal processing circuit, or the like. In this case, high operation speed can be achieved.

The transistor 702 illustrated in FIG. 7 corresponds to the first transistor 106 in FIG. 1A which is described in Embodiment 1. The transistor 700 illustrated in FIG. 7 corresponds to the first transistor 306 or the second transistor 308 in FIG. 3 which is described in Embodiment 1. Accordingly, the conductive layer 718 in FIG. 7 functions as a data holding portion.

Since a transistor with small off-state current can be manufactured as described in this embodiment, a semiconductor device which is one embodiment of the present invention can be achieved. Note that the transistor with small off-state current is not limited to the transistor described in this embodiment. There is no particular limitation on the structure of the transistor with small off-state current as long as the transistor has small off-state current that allows the data holding portion to hold data for a necessary period of time.

This application is based on Japanese Patent Application serial no. 2012-091727 filed with the Japan Patent Office on Apr. 13, 2012, the entire contents of which are hereby incorporated by reference.

What is claimed is:

1. An isolator circuit comprising:
   a first terminal;
   a second terminal;
   a first transistor;
   a second transistor;
   a first buffer; and
   a second buffer,
   wherein the first terminal is electrically connected to one of a source and a drain of the first transistor,
   wherein the first terminal is electrically connected to an output terminal of the second buffer,
   wherein the other of the source and the drain of the first transistor is electrically connected to an input terminal of the first buffer,
   wherein an input terminal of the second buffer is electrically connected to one of a source and a drain of the second transistor,
   wherein the second terminal is electrically connected to an output terminal of the first buffer, and
   wherein the second terminal is electrically connected to the other of the source and the drain of the second transistor.

2. The isolator circuit according to claim 1, wherein an off-state current per micrometer of channel width in each of the first transistor and the second transistor is $1 \times 10^{-17}$ A or lower.

3. The isolator circuit according to claim 1, wherein each of the first buffer and the second buffer comprises an inverter circuit and a clocked inverter circuit.

4. The isolator circuit according to claim 1, wherein a channel formation layer of each of the first transistor and the second transistor is formed in an oxide semiconductor layer.

5. A semiconductor device comprising:
   a logic circuit;
   a signal line; and
   the isolator circuit according to claim 1,
   wherein the logic circuit and the signal line are electrically connected to each other through the isolator circuit.

6. A semiconductor device comprising:
   logic circuits;
   a signal line; and
   the isolator circuits according to claim 1,
   wherein one of the logic circuits is electrically connected to the signal line through one of the isolator circuits.

7. A semiconductor circuit comprising:
   a first terminal;
   a second terminal;
   a first transistor;
   a second transistor;
   a first buffer; and
   a second buffer,
   wherein the first terminal is electrically connected to one of a source and a drain of the first transistor,
   wherein the first terminal is electrically connected to an output terminal of the second buffer,
   wherein the other of the source and the drain of the first transistor is electrically connected to an input terminal of the first buffer,
   wherein an input terminal of the second buffer is electrically connected to one of a source and a drain of the second transistor,
   wherein the second terminal is electrically connected to an output terminal of the first buffer,
   wherein the second terminal is electrically connected to the other of the source and the drain of the second transistor, and
   wherein a channel formation layer of each of the first transistor and the second transistor is formed in an oxide semiconductor layer.

8. The semiconductor circuit according to claim 7, wherein each of the first buffer and the second buffer comprises an inverter circuit and a clocked inverter circuit.

9. The semiconductor circuit according to claim 7, wherein the oxide semiconductor layer comprises at least one of indium, gallium and zinc.

10. The semiconductor circuit according to claim 7, wherein a hydrogen concentration of the oxide semiconductor layer is $5 \times 10^{19}$ atoms/cm$^3$ or lower.

11. The semiconductor circuit according to claim 7, wherein a carrier density of the oxide semiconductor layer is lower than $1 \times 10^{14}$/cm$^3$.

12. The semiconductor circuit according to claim 7, wherein an off-state current per micrometer of channel width in each of the first transistor and the second transistor is $1 \times 10^{-17}$ A or lower.

13. A semiconductor device comprising:
   a logic circuit;
   a signal line; and
   the semiconductor circuit according to claim 7,
   wherein the logic circuit and the signal line are electrically connected to each other through the semiconductor circuit.

14. A semiconductor device comprising:
   logic circuits;
   a signal line; and
   the semiconductor circuits according to claim 7,
   wherein one of the logic circuits is electrically connected to the signal line through one of the semiconductor circuits.

15. A semiconductor device comprising:
   a first logic circuit;
   a second logic circuit; and
   a semiconductor circuit, the semiconductor circuit comprising;
      a first terminal;
      a second terminal;
      a transistor; and
      a buffer,
   wherein the first terminal is electrically connected to the first logic circuit,
   wherein the first terminal is electrically connected to one of a source and a drain of the transistor,
   wherein the other of the source and the drain of the transistor is electrically connected to an input terminal of the buffer,
   wherein the second terminal is electrically connected to an output terminal of the buffer,
   wherein the second terminal is electrically connected to the second logic circuit, and
   wherein data output from the first logic circuit is held in the semiconductor circuit so that the second logic circuit is capable of processing the data when the first logic circuit is turned off.

16. The semiconductor device according to claim 15, wherein the buffer comprises an inverter circuit and a clocked inverter circuit.

17. The semiconductor device according to claim 15, wherein a channel formation layer of the transistor is formed in an oxide semiconductor layer.

18. The semiconductor device according to claim 17, wherein the oxide semiconductor layer comprises at least one of indium, gallium and zinc.

19. The semiconductor device according to claim 17, wherein a hydrogen concentration of the oxide semiconductor layer is $5\times10^{19}$ atoms/cm$^3$ or lower.

20. The semiconductor device according to claim 17, wherein a carrier density of the oxide semiconductor layer is lower than $1\times10^{14}$/cm$^3$.

* * * * *